United States Patent
Iizuka et al.

(10) Patent No.: US 8,232,828 B2
(45) Date of Patent: Jul. 31, 2012

(54) ANALOG CIRCUIT HAVING IMPROVED RESPONSE TIME

(75) Inventors: Shinichi Iizuka, Gyunggi-do (KR); Sang Hee Kim, Seoul (KR); Jun Kyung Na, Gyunggi-do (KR); Sang Hoon Ha, Gyunggi-do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 120 days.

(21) Appl. No.: 12/835,143

(22) Filed: Jul. 13, 2010

(65) Prior Publication Data

US 2011/0140756 A1 Jun. 16, 2011

(30) Foreign Application Priority Data

Dec. 16, 2009 (KR) .......................... 10-2009-0125655

(51) Int. Cl.
*H03L 5/00* (2006.01)
*H03F 3/45* (2006.01)

(52) U.S. Cl. .......... 327/318; 330/252; 330/253; 327/52; 327/54

(58) Field of Classification Search .................... 327/318
See application file for complete search history.

(56) References Cited

U.S. PATENT DOCUMENTS

| 6,809,589 | B2* | 10/2004 | Manganaro ................... 330/260 |
| 7,450,354 | B2* | 11/2008 | Tain et al. ........................ 361/18 |
| 7,501,853 | B2* | 3/2009 | Ueda ............................... 326/33 |
| 7,502,719 | B2* | 3/2009 | Moraveji ....................... 702/185 |
| 2002/0175772 | A1* | 11/2002 | Cyrusian et al. ................. 331/57 |
| 2005/0024084 | A1* | 2/2005 | Hirata et al. ..................... 326/30 |
| 2005/0285819 | A1 | 12/2005 | Onozawa et al. |
| 2007/0290759 | A1* | 12/2007 | Sicurella et al. .............. 330/288 |
| 2009/0195290 | A1* | 8/2009 | Moraveji ....................... 327/331 |

FOREIGN PATENT DOCUMENTS

| JP | 200647953 A | 2/2006 |
| KR | 1020000003881 A | 1/2000 |

OTHER PUBLICATIONS

Korean Office Action 10-2009-0125655 dated Jun. 27, 2011.

* cited by examiner

*Primary Examiner* — Ryan Jager
(74) *Attorney, Agent, or Firm* — Lowe, Hauptman, Ham & Berner, LLP

(57) ABSTRACT

There is provided an analog circuit having improved response time. An analog circuit having improved response time may include: a low level limiter converting a signal having a lower level than a predetermined reference level into a signal having a predetermined non-low level higher than the predetermined reference level; and an analog circuit section amplifying the signal from the low level limiter into a signal having a predetermined level.

3 Claims, 3 Drawing Sheets

ANALOG CIRCUIT HAVING IMPROVED RESPONSE TIME

CROSS-REFERENCE TO RELATED APPLICATIONS

This application claims the priority of Korean Patent Application No. 10-2009-0125655 filed on Dec. 16, 2009, in the Korean Intellectual Property Office, the disclosure of which is incorporated herein by reference.

BACKGROUND OF THE INVENTION

1. Field of the Invention

The present invention relates to analog circuits that are applicable to communications systems, and more particularly, to an analog circuit that can improve response time by converting a signal having a low level, including zero, into a signal having a non-low level, set to be higher than a reference level, to thereby reduce a turn-on time delay (Td).

2. Description of the Related Art

Recently, research has been actively conducted into voltage-supply circuits and current-supply circuits using complementary metal-oxide-semiconductor (CMOS) technologies. Voltage followers are one of the most widely used circuits.

FIG. 1 is a circuit diagram illustrating a voltage follower according to the related art.

A voltage follower 10 according to the related art, shown in FIG. 1, is a buffer amplifier using an operational amplifier. The voltage follower 10 outputs an output voltage Vout from an input signal Vin without amplifying the level thereof.

The voltage follower 10 according to the related art causes a delay in an output voltage when an input voltage reaches zero voltage, and undergoes a drastic reduction in response time. That is, when the input voltage has a low level such as zero voltage, response time at the turn-on time of the voltage follower is markedly reduced.

FIG. 2 is a graph illustrating the response characteristics of the voltage follower of FIG. 1.

Referring to FIG. 2, in the voltage follower according to the related art, the response time of an amplifier of the voltage follower varies according to an input range of the input signal Vin.

In particular, when the amplifier is switched from an OFF-state to an ON-state, as shown in FIG. 2, the response time of the amplifier of the voltage follower is reduced to cause a time delay (Td). This delay, caused when the amplifier is turned on, adversely affects the operation of a circuit at a rear stage, thereby reducing the response time of the entire system.

SUMMARY OF THE INVENTION

An aspect of the present invention provides an analog circuit that can improve response time by converting a signal having a low level, including zero, into a signal having a non-low level, set to be higher than a reference level, to thereby reduce a turn-on time delay (Td).

According to an aspect of the present invention, there is provided an analog circuit having improved response time, the analog circuit including: a low level limiter converting a signal having a lower level than a predetermined reference level into a signal having a predetermined non-low level higher than the predetermined reference level; and an analog circuit section amplifying the signal from the low level limiter into a signal having a predetermined level.

The analog circuit section may include a voltage follower composed of a first operational amplifier having a non-inverting input terminal connected to an output terminal of the low level limiter, an inverting input terminal, and an output terminal connected to the non-inverting input terminal.

The predetermined non-low level of the low level limiter may be set to a level allowing for a reduction in a response delay of the analog circuit section.

The low level limiter may include: a second operational amplifier having an inverting input terminal connected to an input terminal, a non-inverting terminal, and an output terminal; a PMOS transistor having a source connected to an operating power terminal, a gate connected to the output terminal of the second operational amplifier, and a drain connected to the non-inverting input terminal of the second operational amplifier; a current source connected between the operating power terminal and the source of the PMOS transistor to thereby generate a predetermined first current; and a first resistor connected between a ground and a connection node between the drain of the PMOS transistor and the non-inverting input terminal of the second operational amplifier.

The first current, generated by the current source, may be set to have a current value so that a voltage, determined by the current source and the first resistor, can reduce the response delay of the first operational amplifier.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
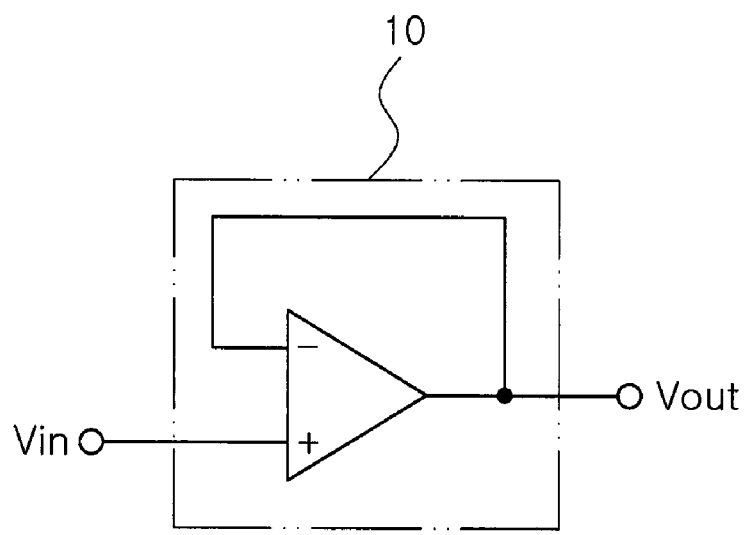
FIG. 1 is a circuit diagram illustrating a voltage follower according to the related art.
Figure 2:
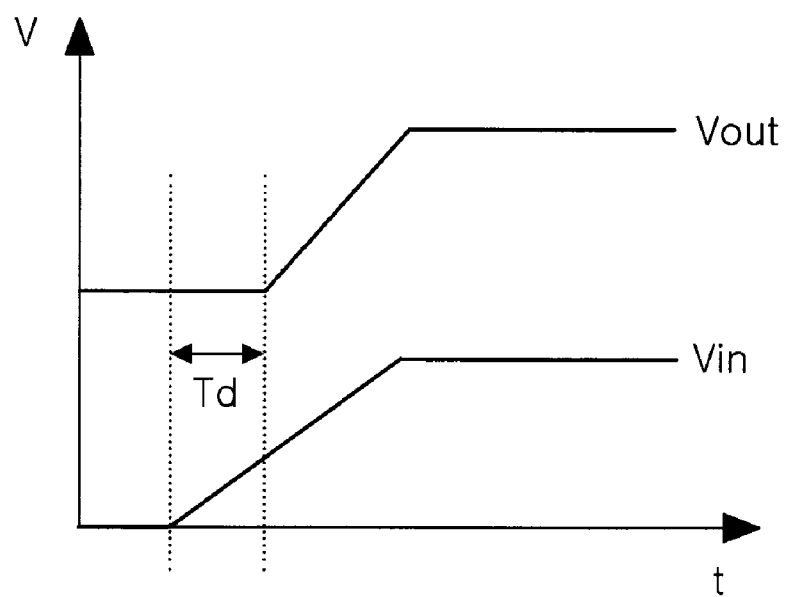
FIG. 2 is a graph illustrating the response characteristic of the voltage follower of FIG. 1.

Exemplary embodiments of the present invention will now be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the same reference numerals will be used throughout to designate the components having substantially the same configuration and function.

Figure 3:
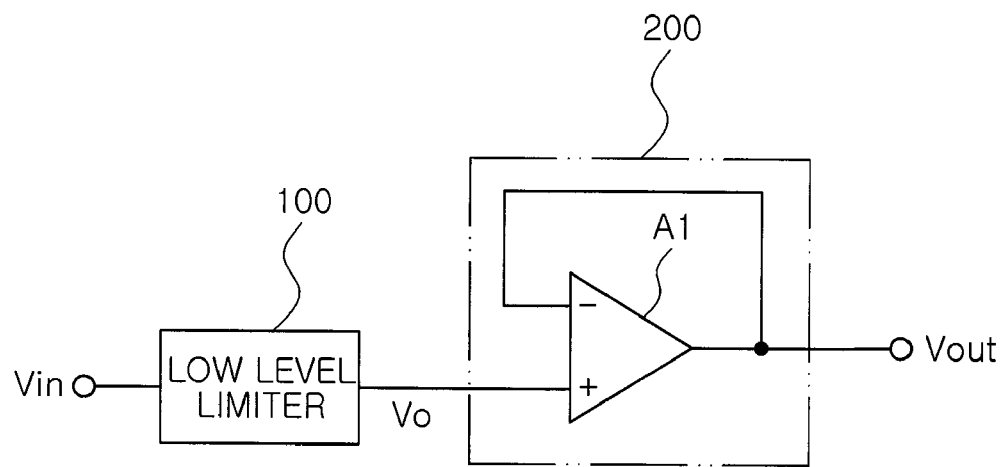
FIG. 3 is a block diagram illustrating an analog circuit according to an exemplary embodiment of the present invention.

FIG. 3 is a block diagram illustrating an analog circuit according to an exemplary embodiment of the invention.

Referring to FIG. 3, an analog circuit according to this embodiment may include a low level limiter 100 and an analog circuit section 200. The low level limiter 100 converts a signal having a lower level than a predetermined reference level into a signal having a predetermined non-low level higher than the predetermined reference level. The analog circuit section 200 amplifies the signal having the non-low level from the low level limiter 100 into a signal having a predetermined level.

The analog circuit section 200 may be composed of a voltage follower formed of a first operational amplifier A1 that has a non-inverting input terminal connected to an output terminal of the low level limiter 100, an inverting input terminal, and an output terminal connected to the inverting input terminal.

The predetermined non-low level of the low level limiter 100 may be set to a level allowing for a reduction in the response time of the analog circuit section 200.

Figure 4:
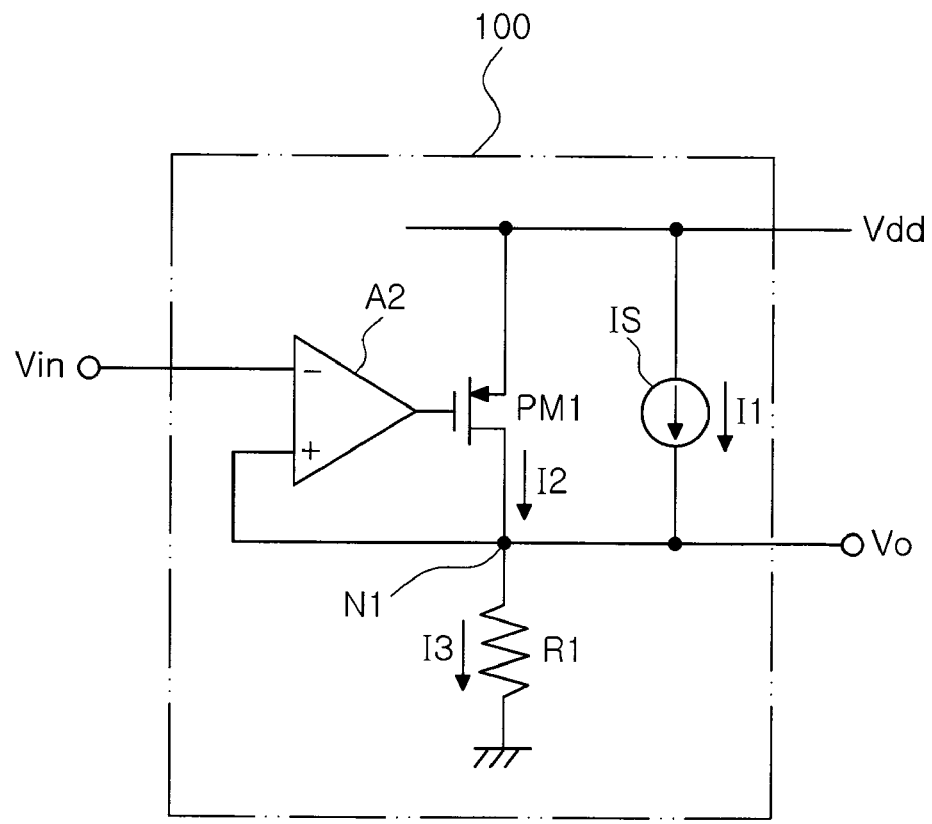
FIG. 4 is a circuit diagram illustrating a low level limiter according to an exemplary embodiment of the present invention.

FIG. 4 is a circuit diagram illustrating a low level limiter according to an exemplary embodiment of the invention.

Referring to FIG. 4, the low level limiter 100 according to this embodiment may include a second operational amplifier A2, a PMOS transistor PM1, a current source IS, and a first resistor R1. The second operational amplifier A2 has an inverting input terminal connected to an input terminal, a non-inverting input terminal, and an output terminal. The PMOS transistor PM1 has a source connected to an operating power Vdd terminal, a gate connected to the output terminal of the second operational amplifier A2, and a drain connected to the non-inverting input terminal of the second operational amplifier A2. The current source IS is connected between the operating power Vdd terminal and the source of the PMOS transistor PM1 to thereby generate a predetermined first current I1. The first resistor R1 is connected between a ground and a connection node N1 between the drain of the PMOS transistor PM1 and the non-inverting input terminal of the second operational amplifier A2.

The first current I1, generated by the current source IS, may be set to have a current value so that a voltage, determined by the first current I1 and the first resistor R1, becomes a voltage allowing for a reduction in the response time of the first operational amplifier A1.

Figure 5:
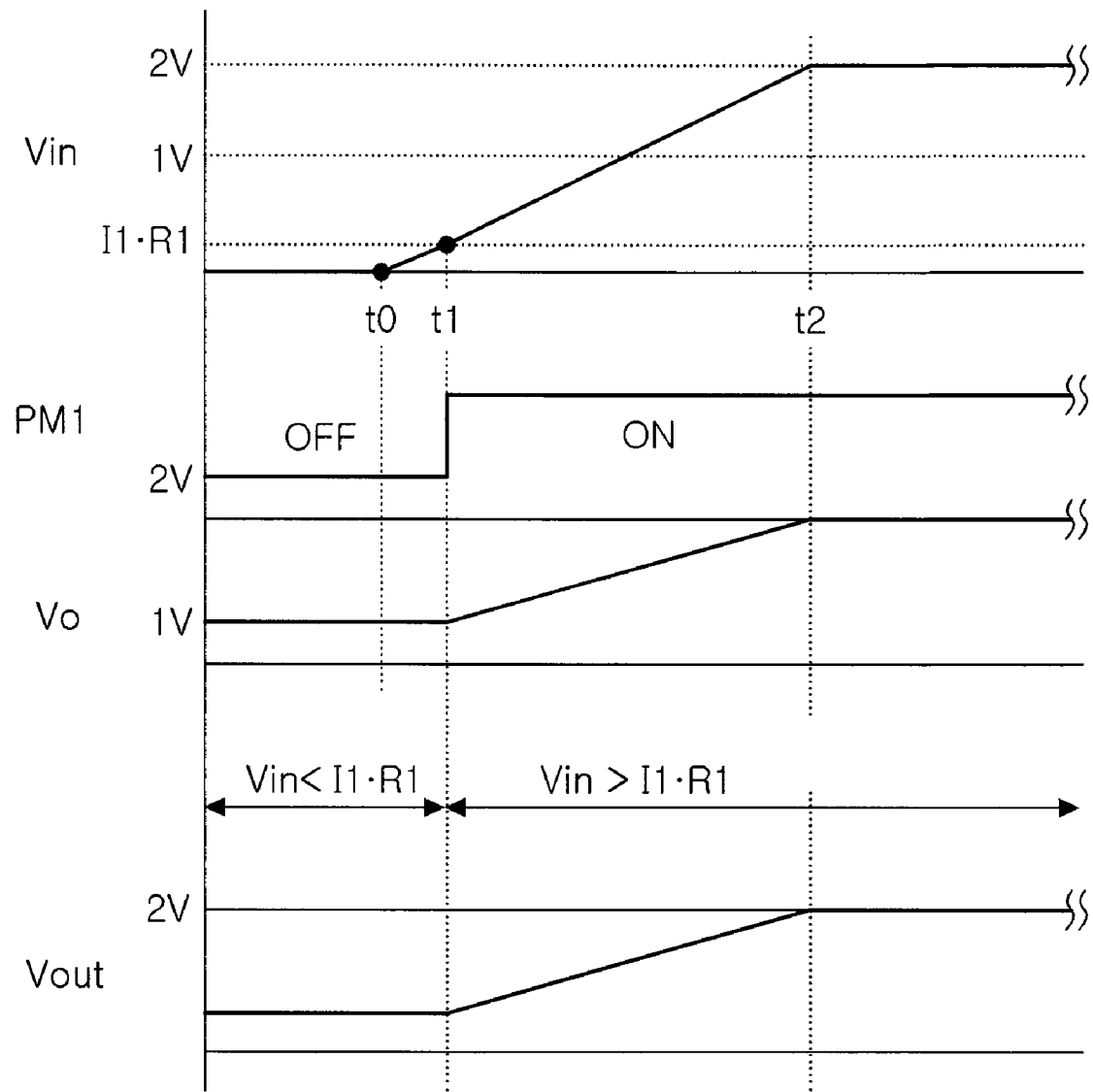
FIG. 5 is a timing chart of main signals according to an exemplary embodiment of the present invention.

FIG. 5 is a timing chart of main signals according to an exemplary embodiment of the invention. In FIG. 5, a reference character Vin refers to an input signal, a reference character Vo refers to an output signal from the low level limiter 100, a reference character Vout refers to an output signal from the analog circuit section 200.

The operation and effects of the invention will be described in detail with the accompanying drawings.

An analog circuit according to an exemplary embodiment of the invention will be described with reference to FIGS. 3 through 5. First, in FIG. 3, the low level limiter 100 according to this embodiment converts a signal having a lower level than a predetermined reference level into a signal having a predetermined non-low level and outputs the signal having the predetermined non-low level to the analog circuit section 200.

The analog circuit section 200 amplifies the signal having the predetermined non-low level from the low level limiter 100 into a signal having a predetermined level.

For example, when the input signal has a level within a range from 0V to 2V, the predetermined non-low level may be set to 0.2V. Here, when the input signal has a lower level than 0.2V, the low level limiter 100 may convert this input signal into a signal having a voltage of 0.2V.

The analog circuit section 200 may be composed of a voltage follower formed of the first operational amplifier A1. Here, the analog circuit section 200 amplifies the signal from the low level limiter 100 at an amplification ratio of "1". The analog circuit section 200 actually inverts a signal being input or outputs the input signal without a change in the level thereof.

Meanwhile, the predetermined non-low level of the low level limiter 100 may be set to a level allowing for a reduction in the response time of the analog circuit section 200.

For example, when the analog circuit section 200 is composed of an operational amplifier, the operational amplifier operates very slowly at zero voltage. Therefore, when zero voltage is input, a delay in the operation of the operational amplifier may occur. However, the low level limiter 100 according to this embodiment converts a signal being input into a non-low level having a predetermined level rather than zero voltage to thereby transmit the signal having the predetermined level to the operational amplifier. Here, the operational amplifier can react without a delay.

An embodiment of the low level limiter 100 will now be described with reference to FIG. 4.

In FIG. 4, when a level of a signal, being input to the inverting input terminal of the second operational amplifier A2, is high enough to turn on the PMOS transistor PM1 connected to the output terminal of the second operational amplifier A2, the PMOS transistor PM1 is turned on.

Here, according to the operational characteristics of the second operational amplifier A2 of the low level limiter 100, the inverting input terminal and the non-inverting input terminal thereof have the same potential. Therefore, when the PMOS transistor PM1 is turned on, a signal being input to the inverting input terminal of the second operational amplifier A2 is output as an output voltage Vo through the output terminal connected to the non-inverting input terminal of the second operational amplifier A2.

$$Vo=(R1 \times I1)+(R1 \times I2)=R1 \times (I1+I2)=R1 \times I3=Vin \quad \text{[Equation 1]}$$

On the other hand, when a signal, being input to the inverting input terminal of the second operational amplifier A, has a level of zero potential, zero potential is applied to the gate of the PMOS transistor PM1 connected to the output terminal of the second operational amplifier A2, the PMOS transistor PM1 is turned off.

Therefore, when the PMOS transistor PM1 is turned off, a current does not flow through the PMOS transistor PM1, and only the current, generated by the current source IS, flows through the first resistor R1. As a result, a voltage, applied to the first resistor R1, satisfies the following Equation 2.

$$Vo=R1 \times I1 \quad \text{[Equation 2]}$$

According to the above Equation 1, when the current is 2 mA, and the resistance is 10Ω, the output voltage Vo becomes 0.2V.

Referring to FIG. 5, the PMOS transistor PM1 starts to be turned off at the time when the input signal Vin is at zero potential, and remains turned off until the input signal Vin reaches a predetermined voltage.

For example, when the PMOS transistor PM1 is turned off, the predetermined voltage becomes a voltage R1×I1 across both terminals of the first resistor R1.

Therefore, when the input signal Vin has a lower level than 0.2V, the low level limiter 100 outputs a voltage of 0.2V, and when the input signal Vin has a level of 0.2V or higher, the low level limiter 100 outputs a voltage equal to the voltage of the input signal Vin.

As described above, according to an exemplary embodiment of the invention, the first operational amplifier of the analog circuit section is turned on at all times by the low level limiter, thereby reducing the turn-on delay time of the first operational amplifier.

Furthermore, the input voltage of the first operational amplifier is controlled so that the first operational amplifier has a voltage within the range allowing the operational amplifier to perform a stable operation. Here, when the input signal Vin has a low level, the output voltage Vo of the low level according to this embodiment has a predetermined value or higher due to the influence of the current source IS.

As set forth above, according to exemplary embodiments of the invention, by converting a signal having a low level, including zero, into a signal having a non-low level, set to be higher than a reference level, a turn-on time delay (Td) is reduced to thereby improve response time.

Therefore, it is possible to prevent a reduction in the speed of the entire system to which an analog circuit is applied.

While the present invention has been shown and described in connection with the exemplary embodiments, it will be apparent to those skilled in the art that modifications and variations can be made without departing from the spirit and scope of the invention as defined by the appended claims.

What is claimed is:

1. An analog circuit having improved response time, the analog circuit comprising:
    a low level limiter for converting a signal having a level lower than a predetermined reference level into a signal having a first predetermined level higher than the predetermined reference level; and
    an analog circuit section for amplifying the signal from the low level limiter into a signal having a second predetermined level, wherein
    the analog circuit section comprises a voltage follower including a first operational amplifier having a non-inverting input terminal connected to an output terminal of the low level limiter, an inverting input terminal, and an output terminal connected to the non-inverting input terminal, and
    the low level limiter comprises:
        a second operational amplifier having an inverting input terminal connected to an input terminal, a non-inverting terminal, and an output terminal;
        a p-channel metal-oxide semiconductor (PMOS) transistor having a source connected to an operating power terminal, a gate connected to the output terminal of the second operational amplifier, and a drain connected to the non-inverting input terminal of the second operational amplifier;
        a current source connected between the operating power terminal and the drain of the PMOS transistor to thereby generate a predetermined first current; and
        a first resistor connected between a ground and a connection node between the drain of the PMOS transistor and the non-inverting input terminal of the second operational amplifier.

2. The analog circuit of claim 1, wherein the low level limiter is configured to have the first predetermined level set to a level allowing for a reduction in a response delay of the analog circuit section.

3. The analog circuit of claim 1, wherein the current source is configured to generate the first current of such a current value that a voltage, defined by the current source and the first resistor, allows for a reduction in a response delay of the first operational amplifier.

* * * * *